US006933084B2

(12) United States Patent
Progler (10) Patent No.: US 6,933,084 B2
(45) Date of Patent: Aug. 23, 2005

(54) ALTERNATING APERTURE PHASE SHIFT PHOTOMASK HAVING LIGHT ABSORPTION LAYER

(75) Inventor: Christopher J. Progler, Plano, TX (US)

(73) Assignee: Photronics, Inc., Brookfield, CT (US)

( * ) Notice: Subject to any disclaimer, the term of this patent is extended or adjusted under 35 U.S.C. 154(b) by 32 days.

(21) Appl. No.: 10/391,001

(22) Filed: Mar. 18, 2003

(65) Prior Publication Data

US 2004/0185348 A1 Sep. 23, 2004

(51) Int. Cl.⁷ ................................................. G01F 9/00
(52) U.S. Cl. ..................................................... 430/5
(58) Field of Search ........................... 430/5, 311, 313, 430/322, 323

(56) References Cited

U.S. PATENT DOCUMENTS

| | | | |
|---|---|---|---|
| 4,178,403 A | 12/1979 | Sakurai et al. | |
| 4,556,608 A | 12/1985 | Kaneki et al. | |
| 4,720,442 A | 1/1988 | Shinkai et al. | |
| 5,451,543 A | 9/1995 | Woo et al. | |
| 5,460,908 A | 10/1995 | Reinberg | |
| 5,472,811 A | 12/1995 | Vasudev et al. | |
| 5,477,058 A | 12/1995 | Sato | |
| 5,482,799 A | 1/1996 | Isao et al. | |
| 5,547,787 A | 8/1996 | Ito et al. | |
| 5,578,402 A | 11/1996 | Watanabe | |
| 5,693,568 A | 12/1997 | Liu et al. | |
| 5,725,973 A | 3/1998 | Han et al. | |
| 5,756,396 A | 5/1998 | Lee et al. | |
| 5,932,377 A * | 8/1999 | Ferguson et al. | 430/5 |
| 5,935,733 A | 8/1999 | Scott et al. | |
| 5,939,227 A | 8/1999 | Smith | |
| 5,955,222 A | 9/1999 | Hibbs et al. | |
| 6,187,480 B1 | 2/2001 | Huang | |
| 6,291,113 B1 * | 9/2001 | Spence | 430/5 |
| 6,335,130 B1 | 1/2002 | Chen et al. | |
| 6,355,557 B2 | 3/2002 | Stinnett et al. | |
| 6,492,069 B1 * | 12/2002 | Wu et al. | 430/5 |
| 6,743,553 B2 | 6/2004 | Shiota et al. | |
| 6,780,548 B1 | 8/2004 | Kalk | |
| 2001/0044056 A1 | 11/2001 | Kokubo | |

FOREIGN PATENT DOCUMENTS

| | | |
|---|---|---|
| JP | 2-39153 | 2/1990 |
| JP | 7-104457 | 4/1995 |
| JP | 8-76353 | 3/1996 |
| JP | 2001-174973 | 6/2001 |

OTHER PUBLICATIONS

Canon Presentation, "Canon's IDEAL: Innovative Double Exposure by Advanced Lithography," BACUS News, SPIE, Apr. 2001, vol. 17, Issue 4, p. 1–7.

T. Ebihara, T. Oga, P.D. Rhyins, M. Sweis, P.M. Martin, "150–nm dense/isolated contact hole study with Canon IDEAL technique", SPIE Proceeding 4562–119.

(Continued)

Primary Examiner—S. Rosasco
(74) Attorney, Agent, or Firm—Amster, Rothstein & Ebenstein LLP (57) ABSTRACT

The present invention generally relates to optical lithography and more particularly relates to the fabrication of transparent or semitransparent phase shifting masks used in the manufacture of semiconductor devices. In particular, the present invention utilizes a light absorbing film in a conventional aaPSMs to balance the intensity of light through each opening of the photomask. The aaPSM of the present invention is used to make semiconductor devices or integrated circuits.

26 Claims, 10 Drawing Sheets

OTHER PUBLICATIONS

R.L. Kosetelak, C. Pierrat, J.G. Garofalo, and S. Vaidya, "Exposure characteristics of alternate aperture phase–shifting masks fabricated using a subtractive process", J. Vac. Sci. Tech. B0, 3055–3061 (1992).

M.D. Levenson, N.S. Viswanathan, and R.A. Simpson, "Improving Resolution with a Phase–Shifting Mask", IEEE Trans. Elect. Dev. ED–29, 1828–1836 (1982).

K.D. Lucas, C.M. Yuan, and A.J. Stroljwas, "A rigorous and practical vector model for phase shigting masks in optical lithography", Proc. SPIE 1674, 252–263 (1992).

Armin Semmler, L. Mader, A. Elsner, R. Koehle, U. Griesinger, C. Noelscher, "Application of 3D EMF Simulation for Development and Optimization of Alternating Phase Shifting Masks", Optical Microlithography XIV, Proceedings of SPIE, 2001, P. 356–367, vol. 4346 (Christopher J. Progler, ed.).

Peng, Song, "Through–Focus Image Balancing of Alternating Phase Shifting Masks", SPIE vol. 3873, p. 328–336 (1999).

T. Terasawa, N. Hasegawa, A. Imai and S. Okazaki, "Analysis of Nonplanar Topography Effects of Phase Shift Masks on Imaging Characteristics", Japanese J. Appl. Phys. 34, 6578–6583 (1995).

T. Teresawa, N. Hasegawa, T. Tanaka, S. Katagiri, and T. Kurosaki, "Improved Resolution of an i–line stepper using a phase–shift mask", J.Vac. Sci. Tech. B8, 1300–1308, (1990).

* cited by examiner

SE: Shallow Etch
DE: Deep Etch

ALTERNATING APERTURE PHASE SHIFT PHOTOMASK HAVING LIGHT ABSORPTION LAYER

FIELD OF THE INVENTION

The present invention generally relates to optical lithography and more particularly relates to improved alternating aperture phase shift masks ("aaPSMs") and methods of making the same.

BACKGROUND OF THE INVENTION

Photomasks are high precision plates containing microscopic images of electronic circuits. Photomasks are typically made from flat pieces of material that are substantially transparent, such as quartz or glass, with an opaque layer, such as chrome, on one side. Etched in the opaque layer (e.g., chrome) of the mask is a pattern corresponding to a portion of an electronic circuit design. A variety of different photomasks, including for example, aaPSMs, embedded attenuated phase shift masks and binary photomasks (e.g., chrome-on-glass), are used in semiconductor processing to transfer these patterns onto a semiconductor wafer or other type of wafer.

Figure 1A:
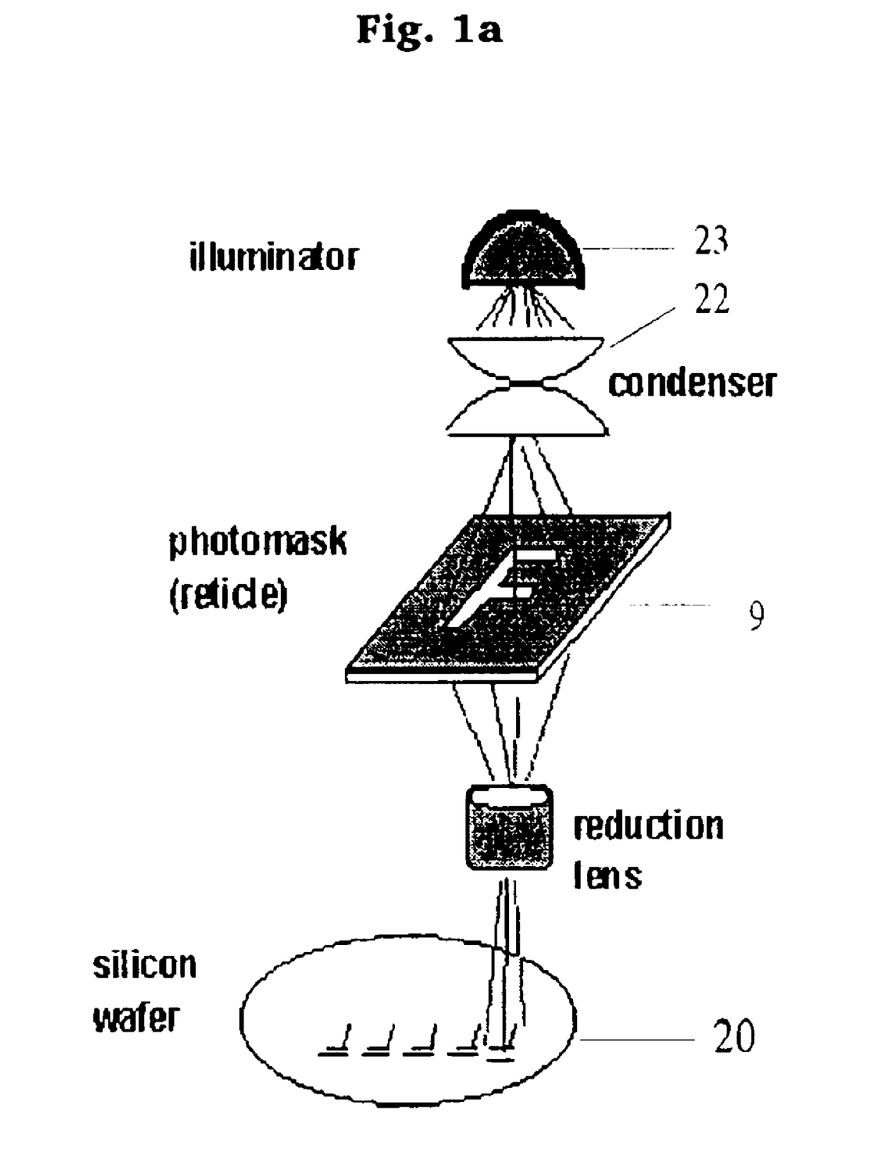
FIG. 1a shows the equipment which can be used to make a semiconductor device from the aaPSM of the present invention.
Figure 1B:
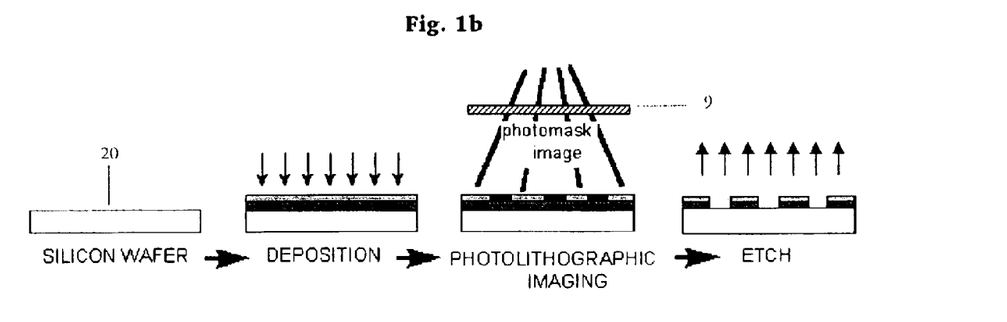
FIG. 1b is flow diagram showing an example of the process for making a semiconductor device.

As shown in FIGS. 1a and 1b, to create an image on a semiconductor wafer 20, a photomask 9 is interposed between the semiconductor wafer 20 (which includes a layer of photosensitive material) and an optical system 22. Energy generated by an energy source 23, commonly referred to as a Stepper, is inhibited from passing through opaque areas of the photomask 9. Likewise, energy from the Stepper passes through the substantially transparent portions of the photomask 9, thereby projecting a diffraction limited, latent image of the pattern on the photomask onto the semiconductor wafer 20. In this regard, the energy generated by the Stepper causes a reaction in the photosensitive material on the semiconductor wafer such that the solubility of the photosensitive material is changed in areas exposed to the energy. Thereafter, the photosensitive material (either exposed or unexposed) is removed from the semiconductor wafer 20, depending upon the type of photolithographic process being used. For example, where a positive photolithographic process is implemented, the exposed photosensitive material becomes soluble and is removed. By contrast, where a negative photolithographic process is used, the exposed photosensitive material becomes insoluble and the unexposed, soluble photosensitive material is removed. After the appropriate photosensitive material is removed, a pattern corresponding to the photomask 9 appears on the semiconductor wafer 20. Thereafter, the semiconductor wafer 20 can be used for deposition, etching, and/or ion implantation processes in any combination to form an integrated circuit.

As circuit designs have become increasingly complex, semiconductor manufacturing processes have become more sophisticated to meet the requirements of these complexities. In this regard, devices on semiconductor wafers have continued to shrink while circuit densities have continued to increase. This has resulted in an increased use of devices packed with smaller feature sizes, narrower widths and decreased spacing between interconnecting lines. For photolithographic processes, resolution and depth of focus (DoF) are important parameters in obtaining high fidelity of pattern reproduction from a photomask to a wafer. However, as feature sizes continue to decrease, the devices' sensitivity to the varying exposure tool wavelengths (e.g., 248 nm, 193 nm, 157 nm, 13 nm, etc.) used to write images on a semiconductor wafer has increased, thereby making it more and more difficult to write to an accurate image on the semiconductor wafer. In this regard, as feature sizes continue to decrease, light diffraction effects in the photomask are exacerbated, thereby increasing the likelihood that defects will manifest in a pattern written on a semiconductor wafer. Accordingly, it has become necessary to develop new methods to minimize the problems associated with these smaller feature sizes.

One known method for increasing resolution in smaller feature sizes involves the use of shorter exposure wavelengths (e.g., 248 nm, 193 nm, 157 nm, 13 nm, etc.). Shorter exposure wavelengths, however, typically result in a shallower DoF in conventional binary chrome-on-glass (COG) photomasks having smaller feature sizes. In this regard, when the feature size is smaller than the exposure tool wavelength, binary COG photomasks become diffraction limited, thereby making it difficult, if not impossible, to write an accurate image on the semiconductor wafer. Accordingly, phase shifting masks ("PSMs") have been used to overcome this problem. In this regard, PSMs are known to have properties which permit high resolution while maintaining a sufficient DoF. More particularly, a PSM reduces the diffraction limitation ordinarily associated with a binary COG mask by passing light through substantially transparent areas (e.g., glass or quartz) which have either different thickness and/or different refractive indices than an ordinary binary COG mask. As a result, destructive interference is created in regions on the target semiconductor wafer that are designed to see no exposure. Thus, by reducing the impact of diffraction through phase shifting, the overall printability of an image is vastly improved such that the minimum width of a pattern resolved by using a PSM is approximately half the width of a pattern resolved in using an ordinary binary COG mask.

Figure 2A:
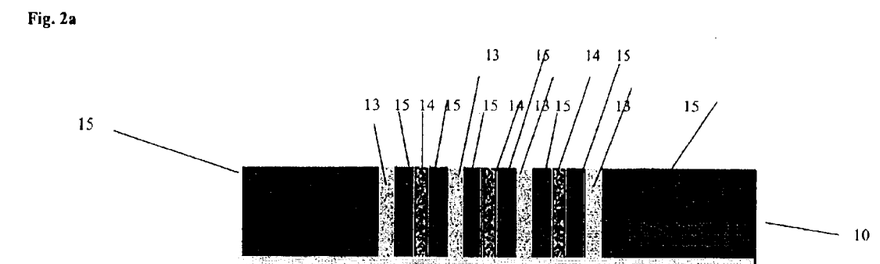
FIG. 2a shows a top view of a conventional aaPSM.
Figure 2B:
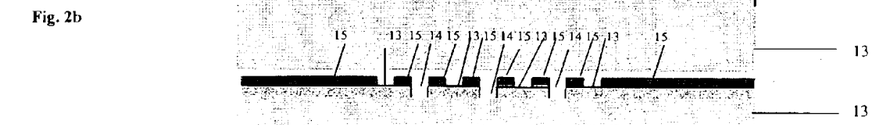
Figure 2C:
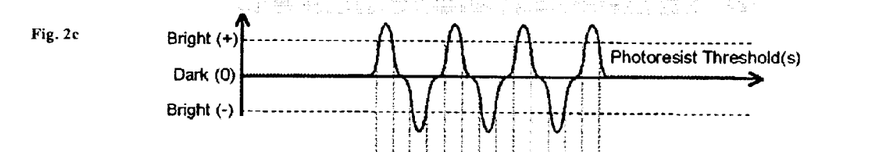
FIG. 2c shows the corresponding transmission of light through etched and un-etched regions of the substantially transparent layer of the conventional aaPSM of FIGS. 2a and 2b.
Figure 2D:
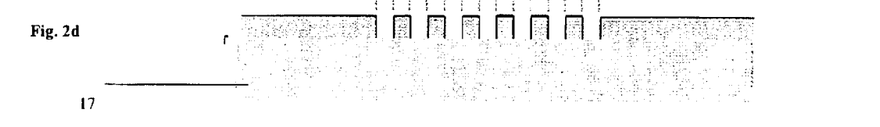
FIG. 2d shows the corresponding regions in a semiconductor wafer onto which the light is transmitted from the aaPSM shown in FIGS. 2a and 2b.

Various types of PSMs have been developed and are known in the art, including aaPSMs. FIGS. 2a–b illustrate an example of a conventional aaPSM 10. An aaPSM is typically comprised of a layer of opaque material and a substantially transparent substrate which is etched on one side of the opaque features, while not etched on the other side (i.e., etching of the transparent substrate occurs in alternating locations in the substantially transparent substrate). More particularly, as shown in FIGS. 2a–b, the aaPSM 10 includes a substantially transparent layer (e.g., quartz) and an opaque layer (e.g., chrome). The opaque layer is etched to form opaque regions 15 and alternating substantially transparent regions 13, as shown in FIG. 2b. The substantially transparent regions 13 are further etched such that the aaPSM 10 has recesses 14 in the substantially transparent layer. In other words, the aaPSM 10 has substantially transparent regions 13 (which are un-etched) that alternate with etched recesses 14 between each opaque region 15, as shown in FIGS. 2a–b. The effect of this structure when placed in a Stepper is to create light intensity of alternating polarity and 180° out of phase, as shown in FIG. 2c. This alternating polarity forces energy transmitted from the Stepper to go to zero, in theory, at opaque regions 15 while maintaining the same transmission of light at the alternating transparent regions 13 and recesses 14. As a result, refraction is reduced through this region. In this regard, in recesses 14, the following equation is satisfied:

$$d = \lambda/2(n-1)$$

where d is film thickness, n is refractive index at exposure wavelength, λ is exposure wavelength. Thus, it is possible to etch smaller features in a semiconductor wafer and use shorter exposure wavelengths. Since the photoresist layer on the semiconductor wafer (FIG. 2d) is insensitive to the phase of the exposed light, the positive and negative exposed regions appear the same, while the zero region in between is clearly delineated. Thus, a sharper contrast between light (i.e., transparent) and dark (i.e., opaque) regions in the resulting photoresist layer of a semiconductor is obtained, thereby making it possible, in theory, to etch a more accurate image onto the semiconductor wafer.

Figure 2E:
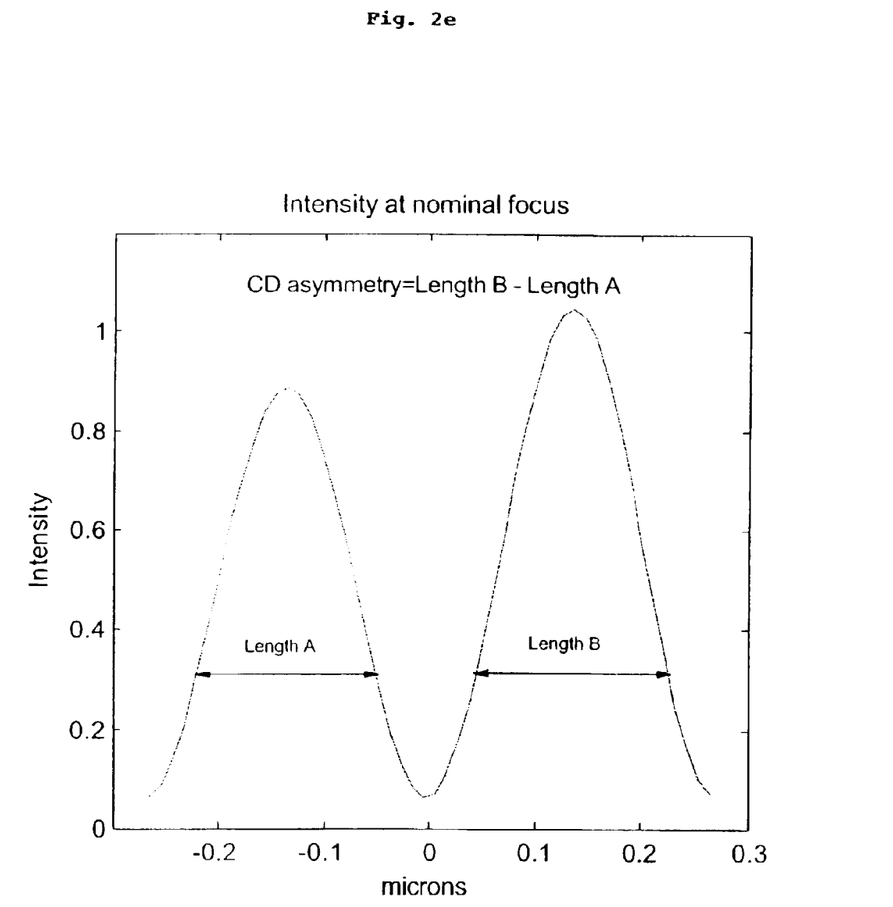
FIG. 2e demonstrates how the aaPSM of FIGS. 2a and 2b experience an imbalanced light intensity when exposed to an energy source.

In practice, however, the aaPSM of FIG. 2b has certain limitations which often preclude the possibility of transferring an accurate image from the aaPSM to a semiconductor wafer. In this regard, as feature sizes continue to get smaller, the intensity of light transmitted through recess 14 will often be less than the intensity of light transmitted through the unetched portions 13. More particularly, referring to FIG. 2e, the light intensity is shown for each transmissive region of the aaPSM of FIGS. 2a and 2b. Length A represents the critical dimensions of recess 14 and Length B represents the critical dimensions of the unetched portion 13 of the substantially transparent layer. As can be seen, the critical dimensions of these features are asymmetrical (Length B–Length A). As a result, the intensity of light transmitted through the unetched portion 13 of the substantially transparent layer is greater than the intensity of light transmitted through the recess 14. This imbalance of light intensity transmitted through these features often make it difficult, if not impossible, to write an accurate image on the a semiconductor wafer using the aaPSM shown in FIG. 2b.

Figure 3A:
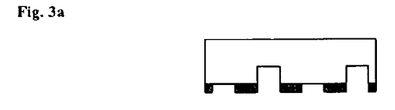
FIG. 3a shows a side view of an anistropically etched aaPSM.
Figure 3B:
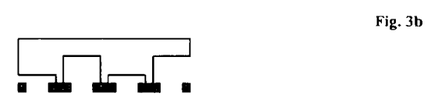
FIG. 3b shows a side view of an aaPSM having anisotropic trenches that have been isotropically undercut using wet etching techniques.
Figure 4A:
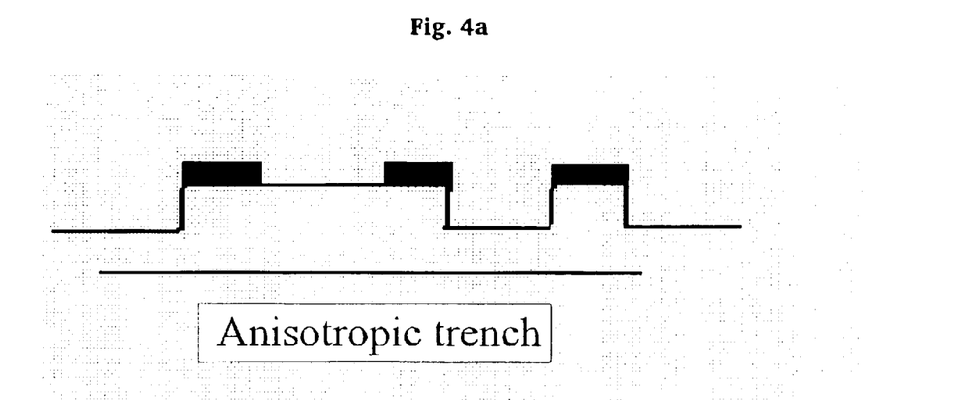
FIG. 4a shows a cross-sectional view of conventional aaPSM having an anisotropic trench.
Figure 4B:
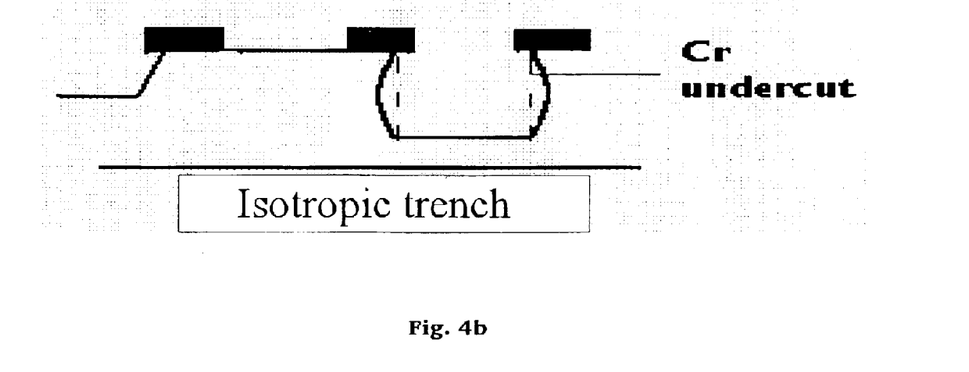
FIG. 4b shows a cross-sectional view of conventional aaPSM having an isotropic trench.

It is known in the art of photomask design to etch highly anisotropic features (i.e., features etched more in one direction than in other directions) in aaPSMs, as shown in FIGS. 3a and 4a. Anisotropic features are typically formed by using a plasma reactor. In particular, it is known to use a fluorocarbon or hydrofluorocarbon etching gas and apply a radio frequency ("RF") bias to the pedestal supporting the photomask. The RF bias creates a direct current ("DC") bias in the plasma adjacent to the mask. The DC bias accelerates the ions towards the mask and the resulting etch is highly anisotropic with nearly vertical sidewalls. In addition to plasma etching techniques, wet etching techniques have been used to undercut features in the phase shift mask, as shown in FIG. 3b.

Figure 3C:
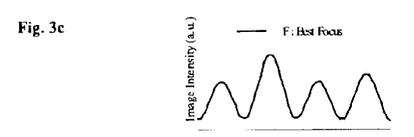
FIG. 3c shows the aerial image intensity of the aaPSM of FIG. 3a when the Stepper is in perfect focus.
Figure 3D:
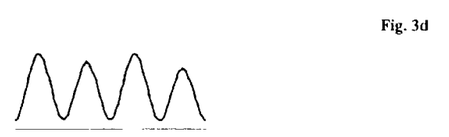
FIG. 3d shows the aerial image intensity of the aaPSM of FIG. 3b when the Stepper is in perfect focus.
Figure 3E:
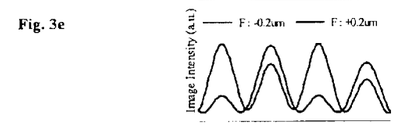
FIG. 3e shows the aerial image intensity of the aaPSM of FIG. 3a when the Stepper is out of focus.
Figure 3F:
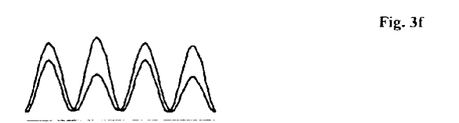
FIG. 3f shows the aerial image intensity of the aaPSM of FIG. 3b when the Stepper is out of focus.
Figure 3G:
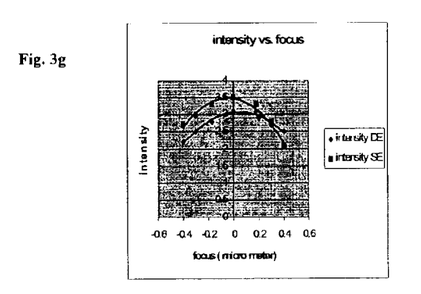
FIG. 3g is a graph showing the aerial image intensity for deep and shallow etched trenches of the aaPSM of FIG. 3a at different focus levels.
Figure 3H:
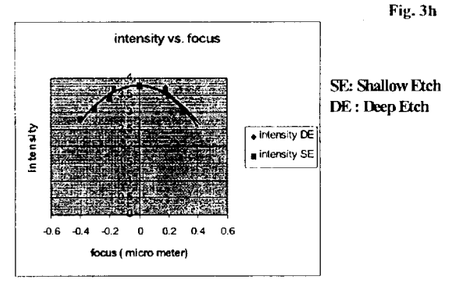
FIG. 3h is a graph showing the aerial image intensity for deep and shallow etched trenches of the aaPSM of FIG. 3b at different focus levels.

However, anisotropic features produce a waveguide effect during wafer printing which induces an aerial image intensity imbalance through focus on the wafer, as shown in FIGS. 3a–3h. For example, as shown in FIGS. 3c, 3e and 3g, aerial image intensity imbalance caused by aaPSM quartz features having sidewalls that have been anisotropically etched can result in a relative difference of exposure intensity at the wafer plane if the stepper is not in perfect focus. For example, where the stepper is −0.4 $\mu$m out of focus, the aerial image intensity of the energy transmitted through the aaPSM of FIG. 3a is approximately 2.8 a.u. for shallow etched features and 2.2 a.u. for deep etched features, and approximately 3.5 a.u. for shallow etched features and 3.0 a.u. for deep etched features when in perfect focus (i.e., 0.0 $\mu$m). Any imbalance in aerial image intensity will result in an inaccurate image being written on the semiconductor wafer. In this regard, since the threshold energy needed to activate photoresist on the wafer is constant, any dissimilarity in intensity for adjacent features will produce a different final critical dimension for adjacent features on the wafer. As a result, the focus latitude required to obtain good pattern transfer from the photomask to the wafer is reduced.

This impact on printability due to the waveguide effect has been shown in the prior art to be effectively eliminated by isotropically etching quartz trench features which were formed by anisotropic etching methods.

A known method for reducing aerial image intensity imbalance is to create isotropic trenches in conventional aaPSMs by utilizing: a dry plasma etching step to form an anisotropic trench; and thereafter, a wet hydrofluoric acid (HF) dip, as described in U.S. Patent Application Publication No. 2001/0044056 A1 to isotropically etch the anisotropic trench. As shown in FIGS. 3a, 3c, 3e and 3g, the aerial image intensity imbalance in this type of aaPSM is significantly reduced when the stepper is out of focus. Although useful for reducing aerial image intensity imbalance, the known methods (e.g., a dry etch followed by a wet etch) has significant drawbacks which have deterred photomask manufacturers from implementing this otherwise useful aaPSM. In particular, HF is known to be a very toxic and corrosive chemical which is hazardous to handle in a production environment. Thus, any alternative method that can achieve the same results without resorting to the use of this hazardous material is preferred. Additionally, HF requires separate processing equipment, and thus, makes the overall manufacture of photomasks more expensive and time consuming. Additionally, since HF is hazardous to the environment, it is necessary to dispose of it in a proper and lawful manner, which can also be costly and burdensome. Furthermore, the wet etch process is purely isotropic in nature and cannot be tuned to prevent excessive undercut and chrome liftoff. Excessive undercut and chrome liftoff is disadvantageous because it can cause defects. Thus, any process which can limit the need for undercutting chrome is preferred, especially where smaller feature sizes are used. An additional concern with respect to wet chemistry is the loading effects of dense to isolated patterned areas. In this regard, an isolated area's etch rates are effected by chemical dilution due to the extreme exposed areas, thereby making it difficult to control the etch time. Thus, wet etching techniques often result in excessive undercut in such exposed areas. Therefore, what is needed is an improved method for manufacturing aaPSMs without an aerial intensity imbalance which avoids using hazardous materials and is tunable to avoid excessive undercut and chrome liftoff and can minimize loading effects.

Although these prior art methods are useful in providing for balanced light intensity for some aaPSM designs, the additional step of undercutting the opaque regions of the photomask is both time-consuming and expensive. Accordingly, the overall number of aaPSMs which could be manufactured in a given time period is limited by these factors. Additionally, as feature sizes continue to get smaller, it will become increasingly difficult to undercut the chrome regions and the problems of chrome liftoff and excessive undercut will become increasingly prevalent. As a result, the use of aaPSMs will become less desirable and potentially obsolete. Moreover, the wet etching techniques of the prior art are known to be hazardous.

Thus, there is a long felt need for a new aaPSM and method for making the same which eliminates the need to undercut the opaque layer while at the same time provides for the transmission of balanced light intensities through the aaPSM.

Accordingly, it is an object of the present invention to provide an improved aaPSM which has a balanced aerial intensity which does not utilize hazardous materials.

It is another object of the present invention to provide an aaPSM for use in photolithography and for semiconductor fabrication to enhance resolution and depth of focus.

It is another object of the present invention to provide an improved aaPSM which has a balanced aerial intensity without excessive undercut and chrome liftoff.

It is another object of the present invention to solve the shortcomings of the prior art.

Other objects will become apparent from the foregoing description.

SUMMARY OF THE INVENTION

It has now been found that the above and related objects of the present invention are obtained in the form of a aaPSM having an intermediate film which balances the aerial intensity between two alternating recesses of different depths.

More particularly, the present invention relates to a blank photomask comprising: a photosensitive resist material layer; an opaque layer underlying the photosensitive resist material layer; a partially absorbing film layer underlying the opaque layer; and a substantially transparent substrate underlying the partially absorbing film layer. The partially absorbing film layer comprises a thickness which substantially balances an aerial image intensity of light transmitted through patterned regions when the blank photomask has been processed into an aaPSM. When processed, the patterned regions comprises at least one opening exposing the partially absorbing film layer and at least one light transmitting opening in which the partially absorbing film layer has been removed.

The present invention is also directed to a method for creating an aaPSM from the blank photomask described above and comprises the step of providing a blank photomask comprising a photosensitive resist material layer, an opaque layer underlying the photosensitive resist material layer, a partially absorbing film layer underlying the opaque layer, and a substantially transparent substrate underlying the partially absorbing film layer. The method further comprises the steps of forming in the blank photomask at least one opening which partially absorbs light, wherein the light absorbing opening exposes the partially absorbing film layer and forming at least one light transmitting opening in the blank photomask. When an aaPSM is formed by this method, the light transmitting opening exposes a portion of the substantially transparent substrate, wherein the partially absorbing film layer comprises a thickness which substantially balances an aerial image intensity of light transmitted through the at least one partially absorbing opening with light transmitted through the at least one light transmitting opening.

Additionally, the present invention is directed to an aaPSM comprising: a substantially transparent substrate having at least one light transmitting opening formed therein; a partially absorbing film layer covering portions of the substantially transparent substrate not defined by the at least one light transmitting opening; and a patterned layer of opaque material affixed to the partially absorbing film. In this aaPSM, the patterned layer exposes at least one portion of the underlying partially absorbing film layer, wherein the partially absorbing film layer comprises a thickness which substantially balances an aerial image intensity of light transmitted through the at least one exposed portion of the at least one partially absorbing film layer with light transmitted through the at least one light transmitting opening.

Additionally, the present invention is directed to another embodiment in which an aaPSM comprises a substantially transparent substrate; a partially absorbing film layer having at least one opening formed therein, wherein portions of the substantially transparent substrate underlying the at least one opening in the partially absorbing film layer are exposed; and a patterned layer of opaque material affixed to the partially absorbing film layer. In this embodiment, the patterned layer of opaque material has at least one opening which exposes underlying portions of the partially absorbing film layer, wherein the partially absorbing film layer comprises a thickness which substantially balances an aerial image intensity of light transmitted through the at least one opening in the opaque layer with light transmitted through at least one opening in the partially absorbing film layer.

Additionally, the present invention is directed to a method for manufacturing a semiconductor comprising the steps of: interposing an aaPSM between a semiconductor wafer and an energy source, wherein the an aaPSM comprises a substantially transparent substrate having at least one light transmitting opening formed therein; a partially absorbing film layer covering portions of the substantially transparent substrate not defined by the at least one light transmitting opening; and a patterned layer of opaque material affixed to the partially absorbing film. The patterned layer of the aaPSM exposes at least one portion of the underlying partially absorbing film layer, wherein the partially absorbing film layer comprises a thickness which substantially balances an aerial image intensity of light transmitted through the at least one partially absorbing opening with light transmitted through the at least one light transmitting opening. The method further comprises the steps of generating energy in the energy source; transmitting the generated energy through light transmitting opening in the substantially transparent substrate and the at least one exposed partially absorbing film layer; and etching an image on the semiconductor wafer corresponding to the light transmitting opening in the substantially transparent substrate and the at least one exposed partially absorbing film layer.

Additionally, the present invention is directed to a method for manufacturing a semiconductor comprising the steps of: interposing an aaPSM between a semiconductor wafer and an energy source, a substantially transparent substrate; a partially absorbing film layer having at least one opening formed therein, wherein portions of the substantially transparent substrate underlying the opening in the partially absorbing film layer are exposed; and a patterned layer of opaque material affixed to the partially absorbing film layer, the patterned layer of opaque material having at least one opening which exposes underlying portions of the partially absorbing film layer, wherein the partially absorbing film layer comprises a thickness which substantially balances an aerial image intensity of light transmitted through the at least one opening in the opaque layer with light transmitted through at least one opening in the partially absorbing film layer. This method further comprises the steps of generating energy in the energy source; transmitting the generated energy through the at least one opening in the partially absorbing film layer and the at least one exposed portion of the partially absorbing film layer; and etching an image on the semiconductor wafer corresponding to at least one opening in the partially absorbing film layer and the at least one exposed portion of the partially absorbing film layer.

BRIEF DESCRIPTION OF THE DRAWINGS

The above and related objects, features and advantages of the present invention will be more fully understood by reference to the following, detailed description of the preferred, albeit illustrative, embodiment of the present invention when taken in conjunction with the accompanying figures, wherein:

FIG. 2b shows a corresponding side view of the conventional aaPSM shown in FIG. 2a;

DETAILED DESCRIPTION OF THE PREFERRED EMBODIMENTS

The present invention is directed to an improved aaPSM and method for making the same. More particularly, the present invention utilizes a partially absorbent, intermediate film in a blank photomask to make an aaPSM which transmits balanced light intensities through each opening in the finished aaPSM. By utilizing a partially absorbent intermediate film in this manner, the step of undercutting the opaque layer of the aaPSM is no longer needed.

Figure 5:
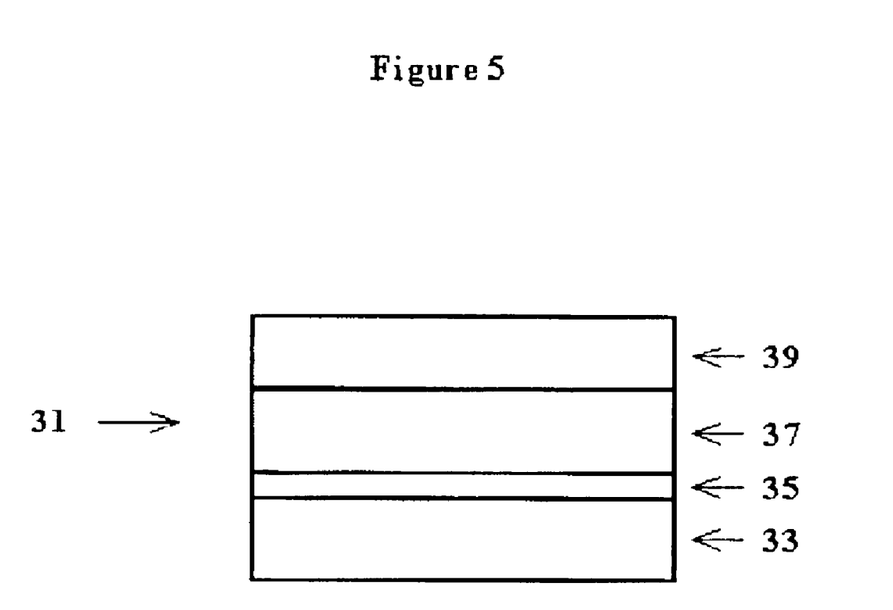
FIG. 5 shows a cross-sectional view of a photomask blank made in accordance with the present invention.

More particularly, referring to FIG. 5 a blank photomask 31 made in accordance with the present invention is shown. The blank photomask 31 preferably includes four layers, but may include additional layers as needed or desired by the photomask maker. In particular, the blank photomask 31 includes a substantially transparent layer 33, such as quartz.

The next layer is a film 35 which is made from materials that are capable of both partially absorbing light and partially transmitting light. Since the photomask 31 will ultimately be processed into an aaPSM, the film should be tuned to have an index and thickness such that, when exposed to an energy source, the light transmitted therethrough will be partially absorbed so as to be in balance with light transmitted through the trenches 38 and 40 (described below) formed in the aaPSM. In this regard, the thickness of the film 35 should be selected in conjunction with the depth of the alternating recess and trenches of the aaPSM of the present invention so as to ensure that the light transmitted through said alternating recesses and trenches is approximately 180° out of phase. Further, the present invention may be used in conjunction with a lateral size bias or lateral size adjustment of either the recesses, trenches or opaque region. A variety of materials can be used as the film 35 of the present invention, including, but not limited to, $MgF_2$, amorphous-Si, $Si_3N_4$, SiON, CrO, CrON, TiN, TiO, TaO, TaN, MoO, MoN, MoON, and any oxide, nitride, fluoride or oxynitride of any metallic element. The next layer is a substantially opaque layer 37 (e.g, chrome) capable of absorbing all (or most) light to which it is exposed. The opaque layer 37 may additionally include an anti-reflective layer, such as chrome oxide, if desired or needed. The next layer is a photosensitive material 39.

To form the aaPSM of the present invention, a pattern defined by an electronic file is transferred to the blank photomask using conventional lithography tools, including, for example, E-beam and/or laser beam writing tools. In one embodiment, the laser source which is used operates at 365 nm, however, the present invention is not limited to this particular wavelength laser source and will work with a variety of different image sources as discussed herein. As described in detail below, the blank photomask 31 is etched to form an aaPSM 41 having types of transmissive regions: (1) an unetched, film recess 40 covering a corresponding unetched portion of the substantially transparent layer 33; and (2) a subtractively etched trench 38 etched in the substantially transparent layer 33. These transmissive regions alternate between opaque regions on the photomask, as shown in FIG. 6.

Figure 6:
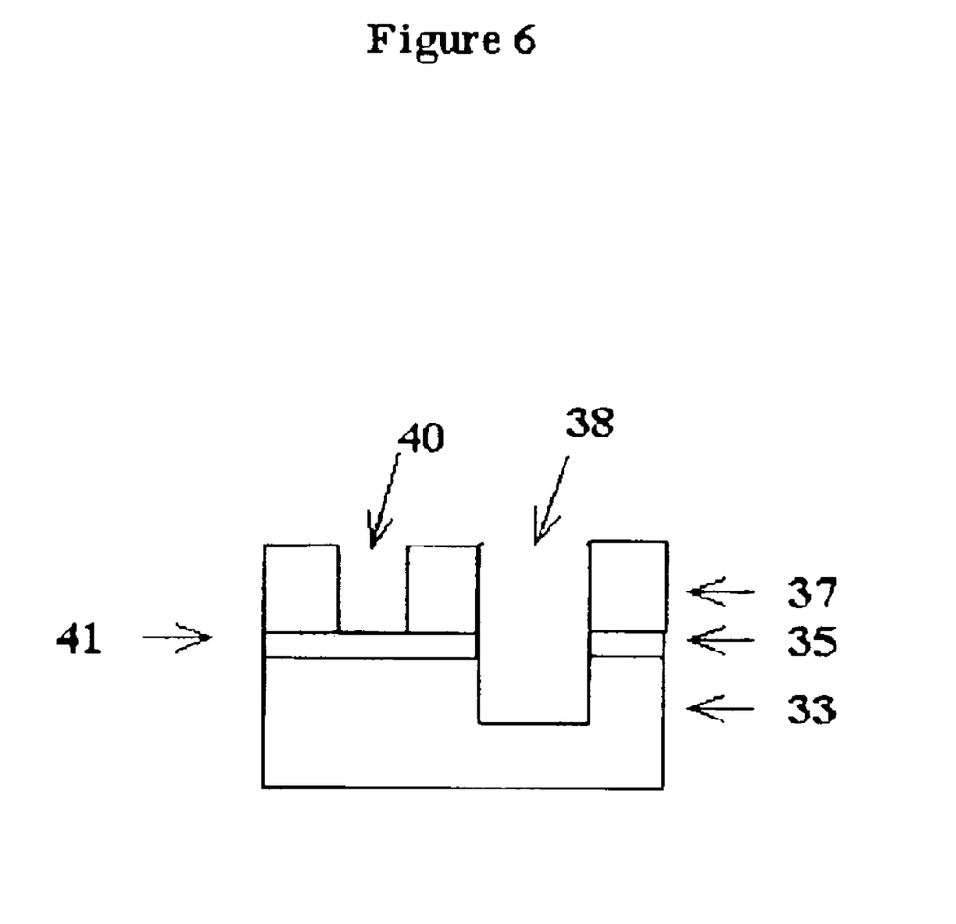
FIG. 6 shows a finished aaPSM made in accordance with the present invention using the photomask blank of FIG. 5.
Figure 7:
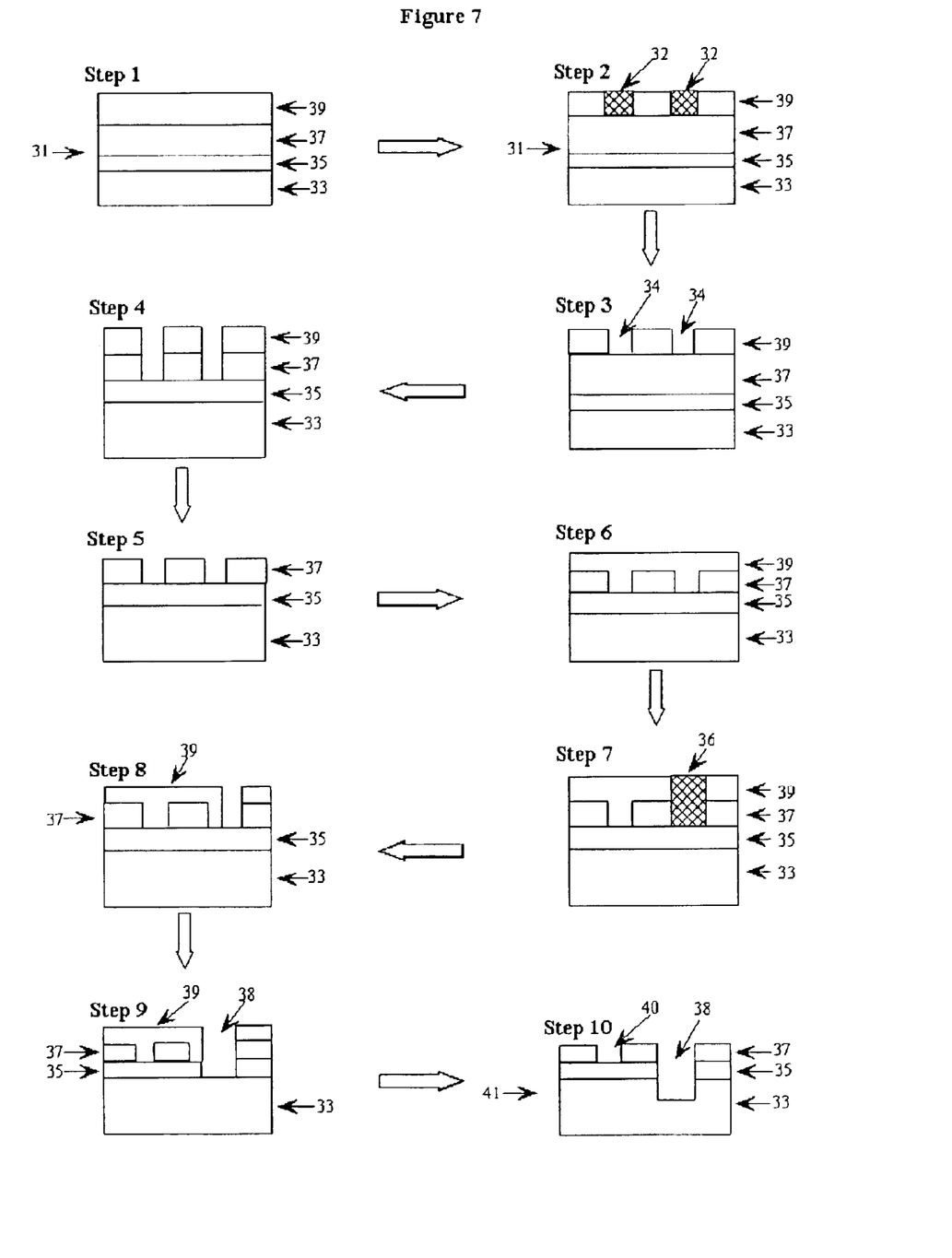
FIG. 7 shows one embodiment of the method for manufacturing the aaPSM shown in FIG. 6.

In one embodiment of the present invention to make the aaPSM of FIG. 6. First, an opaque region is defined in the photomask. In one embodiment, this is accomplished by several steps. Referring to FIG. 7, the blank photomask of FIG. 5 is provided, Step 1. Predefined areas 32 in the photosensitive resist layer 39 of the blank photomask 31 are exposed to an energy source (e.g., a light source), Step 2. Thereafter, the exposed photoresist 32 is developed (i.e., removed), thereby forming a recess 34 in the photosensitive resist layer 31, Step 3. Next, the portions of the opaque layer 37 underlying the recesses 34 are removed by conventional etching techniques (e.g., dry etching or chemical etching), Step 4. Thereafter, the remaining photosensitive resist 39 overlying the undeveloped portions of the opaque layer 37 is removed, thereby exposing portions of the film 35 underlying the removed portions of the opaque layer 37, Step 5. As a result, the un-etched portions of the opaque layer 33 serve to block the exposure light during wafer printing, whereas the portions of the opaque layer which have been etched away define the region of the film 35 and substantially transparent layer 33 which allows exposure light from the Stepper to pass through. In essence, the first processing stage of the method of the present invention is used to form a modified version of a conventional binary photomask by patterning an opaque layer.

Next, alternating phase-shift features are formed in the substantially transparent layer 33. This is also accomplished in several steps in this embodiment of the present invention. In particular, after Step 5 has been completed, the remaining portions of the opaque layer 33 and the uncovered portions of the film 35 are re-coated with photosensitive resist 39, Step 6. Predefined areas 36 in the photosensitive resist layer 39 of the photomask are exposed to an energy source, Step 7. In this regard, these predefined areas preferably alternate with the recesses 40 wherein a portion of chrome separates each alternating recess 40 and predefined area. However, the present invention is not limited to PSMs which have alternating etched regions. It may also be used in any PSM which has etched regions of different depths, whether alternating or not. Next, the exposed areas 36 of the photosensitive resist layer 39 are developed (i.e., removed), Step 8. Thereafter, the portions of the film 35 and the corresponding, underlying portions of the substantially transparent layer 33 that are no longer covered by photosensitive resist material 39 (or opaque material 33) are etched to a specified depth, Step 9. As a result, a phase shifted, transmissive vertical trench 43 is formed in the substantially transparent layer 35. Thereafter, the remaining photoresist 39 is removed, Step 10. The result is an aaPSM having a vertical trench 38 alternating with unetched recess 40 of the substantially transparent layer that are covered by the film 35. The specified depth and the thickness of film 35 are determined so that the light that passes through the unetched recess 40 is approximately 180° out of phase from light that passes through the vertical trench 38.

It is noted, however, that the method for processing the aaPSM of the present invention is not limited to the particular processing steps. In this regard, the processing method could be modified so long as the same results are achieved. Additionally, it is noted that the aaPSM of the present invention can be modified to be etched to different depths.

Figure 8:
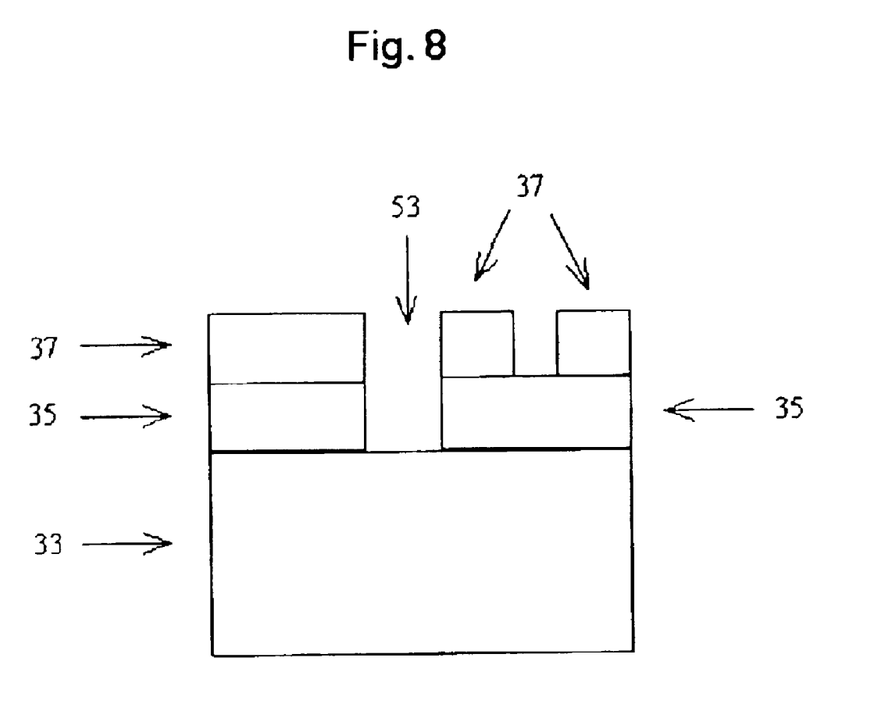
FIG. 8 shows another embodiment by which the photomask blank of FIG. 5 is processed into a finished photomask.

For example, in another embodiment, the blank photomask of FIG. 5 could be processed to form a modified aaPSM in which the substantially transparent layer does not need to be etched. Referring to FIG. 8, the blank photomask 31 could be processed to form a pattern in the mask having alternating trench depths wherein a first trench 51 is formed by simply removing the pre-defined portion of the opaque layer 37, thereby exposing the underlying partially absorbing film 51. Additionally a second trench 53 is formed by removing a second predefined portion of the opaque layer 37 and additionally removing the underlying portion of the partially absorbing film 35 which corresponds to the second predefined portion of the opaque layer 37. Of course, additionally trenches may need to be formed depending on the overall design of the photomask. The partially absorbing film 35 should be of a sufficient thickness such that the phase delay of light transmitted through the first trench 51 and the second trench 53 approximately 180° out of phase and otherwise substantially equal. Depending upon the application, it may be desirable to use a thicker film and a shallower trench, or vice versa. The film thickness could be calculated through trial and error, through photomask modeling techniques or other known techniques. An additional advantage of this embodiment is that the trenches and recesses will have a natural etch stop for these manufacturing processes.

By making and using an aaPSM having a film as described herein and shown in FIGS. 5–8, there is zero asymmetry between the critical dimensions of the trench 38 and the unetched recess 40 of the substantially transparent layer 33 covered by the film 35. As a result, the light intensity transmitted through these regions is balanced. Thus, it is possible to write an accurate image on a semiconductor wafer in a more efficient manner than was possible by prior art methods. In this regard, since the method of the present invention requires fewer etching steps (i.e., it does not require the step of undercutting the opaque layer), the overall output of aaPSMs over a given time period increases.

Now that the preferred embodiments of the present invention have been shown and described in detail, various modifications and improvements thereon will become readily apparent to those skilled in the art. For example, the present invention is not limited to the precise processing steps described herein. In this regard, the aaPSM of the present invention may be made with fewer or more processing steps, depending upon the equipment used and needs of the photomask maker. Further, the method of the present invention may also, for example, form all the unetched regions 40 in a series of processing steps, and form the etched regions 38 in a second series of processing steps. Thus, the present embodiments are therefor to be considered in all respects as illustrative and not restrictive, the scope of the invention being indicated by the appended claims, and all changes that come within the meaning and range of equivalency of the claims are therefore intended to be embraced therein.

What is claimed is:

1. A blank alternating aperture phase shift photomask comprising:
   a photosensitive resist material layer;
   an opaque layer underlying said photosensitive resist material layer;
   a partially absorbing film layer underlying said opaque layer; and
   a substantially transparent substrate underlying said partially absorbing film layer, wherein said partially absorbing film layer comprises a thickness which substantially balances an aerial image intensity of light transmitted through patterned regions when said blank photomask has been processed into an alternating aperture phase shift photomask, wherein
   said patterned regions comprise at least one opening exposing said partially absorbing film layer, and
   at least one light transmitting opening in which said partially absorbing film layer has been removed.

2. The blank alternating aperture phase shift photomask of claim 1, wherein said partially absorbing film layer reduces the light transmitted therethrough when exposed to an energy source.

3. The blank alternating aperture phase shift photomask of claim 1, wherein said partially absorbing film layer is made from material selected from the group consisting of: $MgF_2$, amorphous Si, $Si_3N_4$, SiON, CrO, CrON, TiN, TiO, TaO, TaN, MoO, MoN and MoON.

4. The blank alternating aperture phase shift photomask of claim 1, wherein said partially absorbing film layer is made from material selected from the group consisting of: an oxide, nitride, fluoride and oxynitride of a metallic element.

5. The blank alternating aperture phase shift photomask of claim 1, wherein said substantially transparent substrate comprises quartz and said opaque layer comprises chromium.

6. A method for creating an alternating aperture phase shift photomask from a blank photomask comprising the steps of:

providing a blank photomask comprising a photosensitive resist material layer, an opaque layer underlying said photosensitive resist material layer, a partially absorbing film layer underlying said opaque layer, and a substantially transparent substrate underlying said partially absorbing film layer;

forming in said blank photomask at least one opening which partially absorbs light, wherein said light absorbing opening exposes said partially absorbing film layer; and forming at least one light transmitting opening in said blank photomask, wherein said light transmitting opening exposes a portion of said substantially transparent substrate, wherein said partially absorbing film layer comprises a thickness which substantially balances an aerial image intensity of light transmitted through said at least one partially absorbing opening with light transmitted through said at least one light transmitting opening.

7. The method of claim 6, wherein said step of forming said at least one light transmitting opening and said at least one partially absorbing opening further comprises the steps of removing at least two portions of said opaque layer thereby exposing said partially absorbing layer underlying said at least two portions of said opaque layer; and removing at least one portion of said partially absorbing film layer corresponding to at least one portion of said two portions of said removed opaque layer; and etching to a predetermined depth at least one portion of said substantially transparent substrate underlying said removed partially absorbing film layer.

8. The method of claim 6, wherein said step of forming said partially transmissive and partially absorbing opening further comprises the steps of:

exposing said photosensitive resist to an energy source;

removing said exposed photosensitive resist; and removing portions of said opaque layer underlying said removed photoresist, thereby exposing said absorbing film.

9. The method of claim 6, wherein said step of forming said light transmitting opening further comprises the steps of:

re-coating said opaque layer and said exposed absorbing film with a second coating of photosensitive resist;

exposing predefined areas of said second coating of photosensitive resist to said energy source;

removing said exposed areas of photosensitive resist;

removing portions of said opaque layer underlying said areas of removed photosensitive resist; and etching said absorbing film and said substantially transparent layer underlying said areas of removed opaque layer to a predetermined depth.

10. The method of claim 6, wherein said partially absorbing layer reduces the transmission of light through when exposed to an energy source.

11. The method of claim 6, wherein said partially absorbing film layer is made from material selected from the group consisting of: $MgF_2$, amorphous Si, $Si_3N_4$, SiON, CrO, CrON, TiN, TiO, TaO, TaN, MoO, MoN and MoON.

12. The method of claim 6, wherein said partially absorbing film layer is made from material selected from the group consisting of an oxide, nitride, fluoride and oxynitride of a metallic element.

13. The method of claim 6, wherein said substantially transparent substrate comprises quartz and said opaque layer comprises chromium.

14. The method of claim 6, wherein said step of forming said at least one light transmitting opening and said at least one partially absorbing opening further comprises the steps of removing at least two portions of said opaque layer thereby exposing said partially absorbing layer underlying said at least two portions of said opaque layer; and removing at least one portion of said partially absorbing film layer corresponding to at least one portion of said two portions of said removed opaque layer.

15. An alternating aperture phase shift photomask comprising:

a substantially transparent substrate having at least one light transmitting opening formed therein;

a partially absorbing film layer covering portions of said substantially transparent substrate not defined by said at least one light transmitting opening; and a patterned layer of opaque material affixed to said partially absorbing film, wherein said patterned layer exposes at least one portion of said underlying partially absorbing film layer, wherein said partially absorbing film layer comprises a thickness which substantially balances an aerial image intensity of light transmitted through said at least one exposed portion of said at least one partially absorbing film layer with light transmitted through said at least one light transmitting opening.

16. The alternating aperture phase shift photomask of claim 15, wherein said at least one exposed portion of said partially absorbing film alternates with said at least one light transmitting opening.

17. The alternating aperture phase shift photomask of claim 15, wherein said partially absorbing film layer is tuned to reduce the transmission of light through when exposed to an energy source.

18. The alternating aperture phase shift photomask of claim 15, wherein said partially absorbing film layer is made from material selected from the group consisting of: $MgF_2$, amorphous Si, $Si_3N_4$, SiON, CrO, CrON, TiN, TiO, TaO, TaN, MoO, MoN and MoON.

19. The alternating aperture phase shift photomask of claim 15, wherein said partially absorbing film layer is made from material selected from the group consisting of an oxide, nitride, fluoride and oxynitride of a metallic element.

20. The alternating aperture phase shift photomask of claim 15, wherein said substantially transparent substrate comprises quartz and said opaque layer comprises chromium.

21. An alternating aperture phase shift photomask comprising:

a substantially transparent substrate;

a partially absorbing film layer having at least one opening formed therein, wherein portions of said substantially transparent substrate underlying said at least one opening in said partially absorbing film layer are exposed; and a patterned layer of opaque material affixed to said partially absorbing film layer, said patterned layer of opaque material having at least one opening which exposes underlying portions of said partially absorbing film layer, wherein said partially absorbing film layer comprises a thickness which substantially balances an aerial image intensity of light transmitted through said at least one opening in said opaque layer with light transmitted through at least one opening in said partially absorbing film layer.

22. The alternating aperture phase shift photomask of claim 21, wherein said at least one exposed portion of said partially absorbing film layer alternates with said at least one opening is said partially absorbing film layer.

23. The alternating aperture phase shift photomask of claim 21, wherein said partially absorbing film layer is tuned to reduce the transmission of light when exposed to an energy source.

24. The alternating aperture phase shift photomask of claim 21, wherein said partially absorbing film layer is made from material selected from the group consisting of: $MgF_2$, amorphous Si, $Si_3N_4$, SiON, CrO, CrON, TiN, TiO, TaO, TaN, MoO, MoN and MoON.

25. The alternating aperture phase shift photomask of claim 21, wherein said partially absorbing film layer is made from material selected from the group consisting of an oxide, nitride, fluoride and oxynitride of a metallic element.

26. The alternating aperture phase shift photomask of claim 21, wherein said substantially transparent substrate comprises quartz and said opaque layer comprises chromium.

* * * * *